(12) United States Patent
Higuchi et al.

(10) Patent No.: US 7,952,016 B2
(45) Date of Patent: May 31, 2011

(54) PHOTOVOLTAIC MODULE COMPRISING A TERMINAL BOX ATTACHED TO THE REAR SURFACE

(75) Inventors: Minoru Higuchi, Kishiwada (JP);
Masaru Hikosaka, Izumisano (JP);
Atsushi Nakauchi, Kaizuka (JP);
Hiroyuki Oda, Sakai (JP); Shingo Okamoto, Toyonaka (JP)

(73) Assignee: Sanyo Electric Co., Ltd., Moriguchi-shi, Osaka (JP)

( * ) Notice: Subject to any disclaimer, the term of this patent is extended or adjusted under 35 U.S.C. 154(b) by 673 days.

(21) Appl. No.: 11/519,233

(22) Filed: Sep. 12, 2006

(65) Prior Publication Data

US 2007/0056625 A1 Mar. 15, 2007

(30) Foreign Application Priority Data

Sep. 13, 2005 (JP) ................................ 2005-265428

(51) Int. Cl.
*H01L 31/042* (2006.01)
*H01L 31/048* (2006.01)

(52) U.S. Cl. ........................ 136/244; 136/251

(58) Field of Classification Search ........... 136/244–265
See application file for complete search history.

(56) References Cited

U.S. PATENT DOCUMENTS

| | | | | |
|---|---|---|---|---|
| 4,241,493 A | * | 12/1980 | Andrulitis et al. | 438/67 |
| 4,392,009 A | | 7/1983 | Napoli | |
| 5,059,254 A | * | 10/1991 | Yaba et al. | 136/251 |
| 5,733,382 A | * | 3/1998 | Hanoka | 136/251 |
| 5,951,785 A | * | 9/1999 | Uchihashi et al. | 136/251 |
| 6,441,300 B2 | | 8/2002 | Sannomiya et al. | |
| 6,667,434 B2 | | 12/2003 | Morizane et al. | |
| 2002/0078991 A1 | | 6/2002 | Nagao et al. | |
| 2006/0219291 A1 | * | 10/2006 | Hikosaka et al. | 136/251 |

FOREIGN PATENT DOCUMENTS

| AU | B-31390/89 | * 11/1988 |
|---|---|---|
| AU | 608701 B | 10/1989 |

(Continued)

OTHER PUBLICATIONS

Chinese Office Action dated Nov. 7, 2008, issued in corresponding Chinese Patent Application No. 2006101538271.

(Continued)

*Primary Examiner* — Basia Ridley
*Assistant Examiner* — Christina Chern
(74) *Attorney, Agent, or Firm* — Westerman, Hattori, Daniels & Adrian, LLP (57) ABSTRACT

This invention provides a photovoltaic module for preventing insulation failure between an outer frame and connection leads. The photovoltaic module comprises: a photovoltaic submodule including a plurality of solar cells interposed between two light-transmitting substrates through the intermediary of an encapsulant and the connection leads extending from an edge between light-transmitting substrates and outputting generated electric currents; a terminal box attached near an edge of the photovoltaic submodule and housing connected parts between the connection leads and cables for outputting the electric currents to the outside; and an outer frame fitting over peripheral edges of the photovoltaic submodule. A side, of the light-receiving side light-transmitting substrate, from which the connection leads are pulled out, is made large so as to extend outward further than the other light-transmitting substrate. The connection leads are led out from the edge between the two light-transmitting substrates to be guided into the terminal box.

7 Claims, 11 Drawing Sheets

FOREIGN PATENT DOCUMENTS

| | | |
|---|---|---|
| EP | 0 325 369 A2 | 7/1989 |
| EP | 1 708 280 A1 | 10/2006 |
| FR | 2629945 A1 | 10/1989 |
| JP | 61-81165 U | 5/1986 |
| JP | 2-2850 U | 1/1990 |
| JP | 4-130457 U | 11/1992 |
| JP | 2704429 B2 | 1/1998 |
| JP | 10-256584 A | 9/1998 |
| JP | 2001-339087 A | 12/2001 |
| JP | 2002-164561 A | 6/2002 |
| JP | 2003-158285 A | 5/2003 |
| JP | 2005-032900 A | 2/2005 |

OTHER PUBLICATIONS

Search Report dated Jan. 15, 2007, issued in corresponding European Application No. 06019116.0.
Non-Final Office Action dated Dec. 24, 2008, issued in U.S. Appl. No. 11/392,865.
European Search Report dated Jul. 19, 2006, issued in corresponding European Patent Application No. 06006870.
Chinese Office Action dated Mar. 13, 2009, issued in corresponding Chinese Patent Application No. 200610067104.
Chinese Office Action dated Jul. 25, 2008, issued in corresponding Chinese Patent Application No. 200610067104.

* cited by examiner

PHOTOVOLTAIC MODULE COMPRISING A TERMINAL BOX ATTACHED TO THE REAR SURFACE

The priority application Number JP2005-265428 upon which this patent application is based is hereby incorporated by reference.

BACKGROUND OF THE INVENTION

1. Field of the Invention

The present invention relates to a photovoltaic module, and is particularly suitable for a double-sided light receiving type photovoltaic module which receives light on both sides.

2. Description of the Prior Art

Photovoltaic power generation which converts light energy into electric energy by utilizing the photoelectric conversion effect is widely used as a means to obtain clean energy, which contributes to the preservation of the global environment. With the improvement in solar cells' photoelectric conversion efficiency, many photovoltaic power generation systems with photovoltaic modules have come to be installed even for residential use.

In order for a photovoltaic module provided with solar cells generating electric power from sunlight to output the generated electric power to the outside, conductors serving as a positive electrode and a negative electrode are disposed in the photovoltaic module, and ends of the conductors are taken out of the photovoltaic module as connection terminals to which cables for outputting electric current to the outside are connected, thereby extracting the electric current.

Connected parts between the connection terminals and the cables are accommodated in a housing called a terminal box for the purpose of protecting the connected parts and preventing leakage of the electric current. Usually, the terminal box is attached in the final process because the terminal box is obstructive during the production process of the module. The terminal box is adhesively fixed to the opposite side of a light-receiving surface of the photovoltaic module or is screwed to an outer frame of the photovoltaic module in order to reduce the weight load on the conductors, connection terminals and connected parts and to avoid looseness caused by vibration and metal fatigue.

Figure 13:
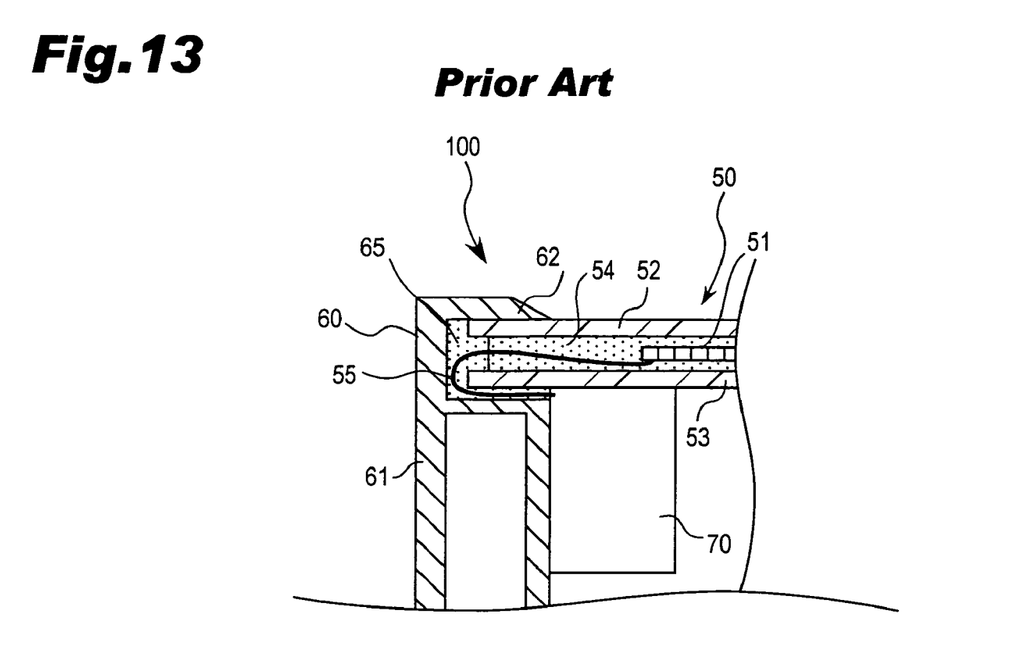
FIG. 13 is a cross-sectional view of a relevant part of a conventional photovoltaic module.

FIG. 13 is a cross-sectional view of a relevant part of a conventional photovoltaic module. As illustrated in FIG. 13, the photovoltaic module 100 comprises a board-shaped photovoltaic submodule (photovoltaic panel) 50 including a plurality of solar cells 51, and an outer frame 60, made of aluminum or other materials, fitting over the edges of the photovoltaic submodule 50 through the intermediary of a sealing material 65. The photovoltaic submodule 50 includes the plurality of solar cells 51 interposed between a light-receiving side light-transmitting substrate 52 made of low iron tempered glass for example and a rear surface side weatherproof substrate 53. A sealing resin 54 such as ethylene vinyl acetate (EVA) fills the inner gap between the light-transmitting substrate 52 and the weatherproof substrate 53.

The outer frame 60 is made by extruding aluminum or the other materials and includes a main body 61 and a fitting part 62 located at the upper part of a main body 61. The fitting part 62 is in the form of a channel in a cross section and fits over the photovoltaic submodule 50. The main body 61 is hollow inside to save weight as well as being relatively thick-walled and robust. A terminal box 70 is adhesively fixed to the rear surface side substrate 53, with one side abutting the inner wall of the outer frame 60. If needed, the terminal box 70 is screwed to the outer frame 60.

In the photovoltaic module 100 with connection leads 55 taken out from an edge of the photovoltaic submodule 50 as shown in FIG. 13, the connection leads 55 connected to the terminal box 70 for extracting electric current is subject to damage because the connection leads 55 are interposed between the substrate 53 and the outer frame 60. Each connection lead 55 has an insulating coating on its surface since it may contact the metal outer frame 60. However, damage to the insulating coating of the connection leads 55 could cause an insulation failure. Thus, the conventional insulating coating needs to be thick enough to prevent the insulation failure caused by the coating damage, which increases the manufacturing cost of the connection lead 55.

A proposed natural lighting type photovoltaic module includes a light-receiving glass and a rear surface sealing glass, either of which is larger than the other, and a terminal box disposed on an expanded part of the larger one with consideration given to high quality in design (e.g. Japanese unexamined patent publication No. 2001-339087).

According to the above-disclosed Japanese unexamined patent publication No. 2001-339087, there is a space standing on a different level around the perimeter of the light-receiving glass or rear surface sealing glass. The space allows the terminal box to be attached thereon without affecting light-collection efficiency. However, the conventional photovoltaic module having the terminal box disposed on the expanded part of the glass cannot be adapted to a type of photovoltaic module in which the photovoltaic submodule is easily fitted into the outer frame, because of the obstructive terminal box.

SUMMARY OF THE INVENTION

It is therefore an object of the present invention to provide a photovoltaic module capable of preventing insulation failure between the outer frame and connection leads without a unique-shaped terminal box.

The photovoltaic module of the present invention is characterized by comprising: a photovoltaic submodule including a plurality of solar cells are interposed between a light-transmitting front surface member and a rear surface member through the intermediary of an encapsulant, and connecting members extending out from an edge between the front surface member and rear surface member for outputting generated electric currents; a terminal box attached near an edge of the photovoltaic submodule and housing connected parts between the connecting members and cables for outputting the generated electric currents to the outside; and an outer frame fitting over peripheral edges of the photovoltaic submodule. The front surface member is made large so that at least one side corresponding to the edge from which the connecting members are pulled out is extended outward further than the rear surface member. The connecting members are led out from between the extended front surface member and the outmost edge of the rear surface member and guided into the terminal box.

According to the above-mentioned structure, the connecting members are not pulled out into the fitting part of the outer frame, thereby preventing the connecting members from disconnection and insulation failure and offering a highly-reliable photovoltaic module.

On the side of the photovoltaic submodule in which the side of the front surface member is extended outward further than the rear surface member, the outer frame fits over the front surface member. On the other sides of the photovoltaic submodule, the outer frame fits over the front surface member and rear surface member.

Further, the terminal box is made of resin and provided with an upright part extending toward the front surface member. The connecting members preferably pass between the upright part of the terminal box and the outmost edge of the rear surface member of the photovoltaic submodule to be guided into the terminal box.

As discussed above, the connecting members led out between the upright part of the terminal box and the outmost edge of the rear surface member and guided into the terminal box is easy to be handled and improves its insulation property due to the upright part interposed between the outer frame and connecting members.

Dummy cells can be provided in an area positioned on the light-transmitting front surface member and above the terminal box. A printed area in the form of the dummy cell can be provided in the area positioned on the light-transmitting front surface member and above the terminal box.

The provision of the dummy cells enhances the aesthetic design of the photovoltaic module.

A printed masking part can be provided in the area positioned on the light-transmitting front surface member and above the terminal box. The masking area can be printed with similar colors to the solar cell.

According to the above structure, the printed area can keep the adhesive used for attaching the terminal box to the rear surface member out of view from the side of the light-receiving surface. In addition, the terminal box can be kept out of view from the side of the light-receiving surface. This allows the appearance of the photovoltaic module to be favorable.

The foregoing and other objects, features, aspects and advantages of the present invention will become more apparent from the following detailed description of the present invention when reviewed in conjunction with the accompanying drawings.

DETAILED DESCRIPTION OF THE PREFERRED EMBODIMENTS

Embodiments of the present invention will be described in detail with reference to the drawings. The same reference numbers are given to components that are identical with or equivalent to each other and their descriptions will be omitted to avoid repetition.

Figure 1:
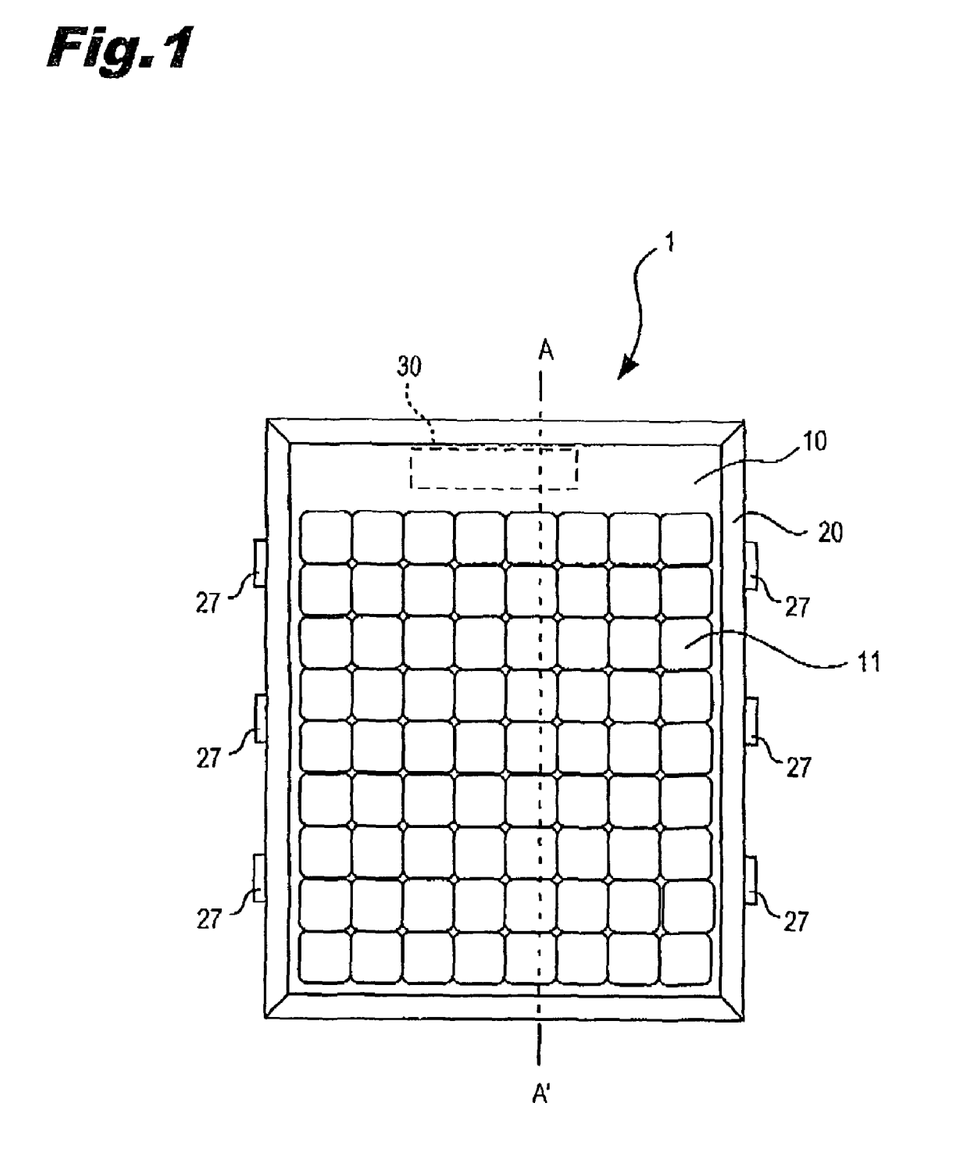
FIG. 1 is a plan view illustrating a photovoltaic module according to the first embodiment of the present invention.
Figure 2:
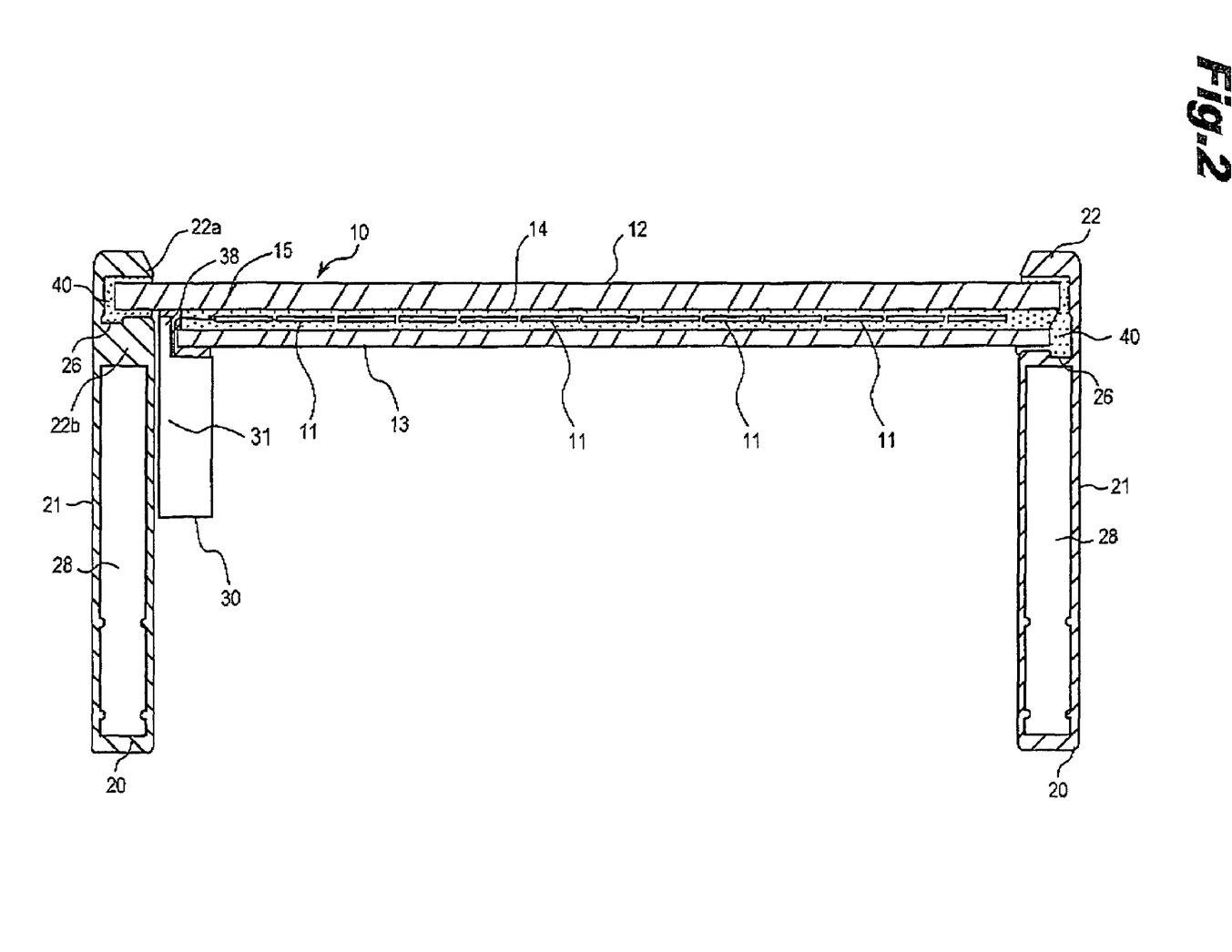
FIG. 2 is a cross-sectional view taken along line A-A' of FIG. 1.
Figure 3:
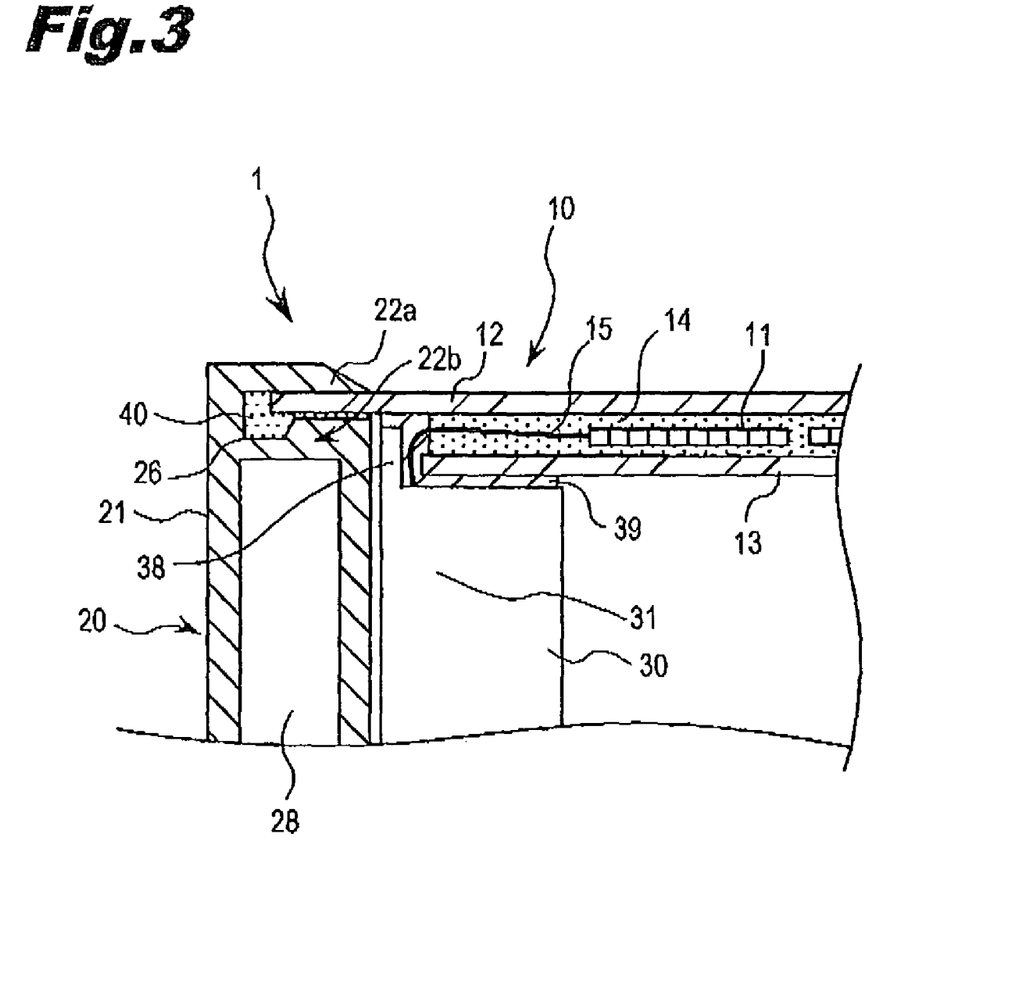
FIG. 3 is a cross-sectional view of a relevant part of the photovoltaic module according to the first embodiment of the present invention.

FIG. 1 is a plan view illustrating a photovoltaic module according to the first embodiment of the present invention. FIG. 2 is a cross-sectional view taken along line A-A' of FIG. 1. FIG. 3 is a cross-sectional view of a relevant part of the photovoltaic module according to the first embodiment of the present invention. In these drawings, connecting inner leads for interconnecting solar cells are omitted.

Figure 4:
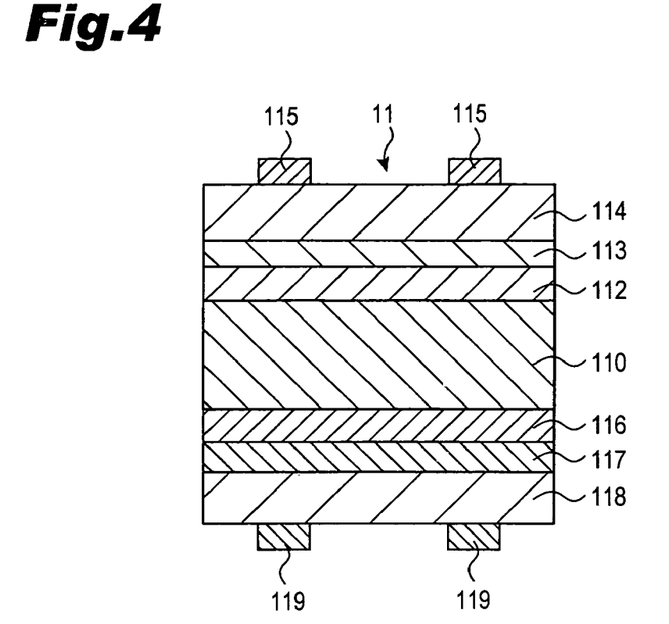
FIG. 4 is a schematic cross-sectional view illustrating a solar cell used in the present invention.
Figure 5:
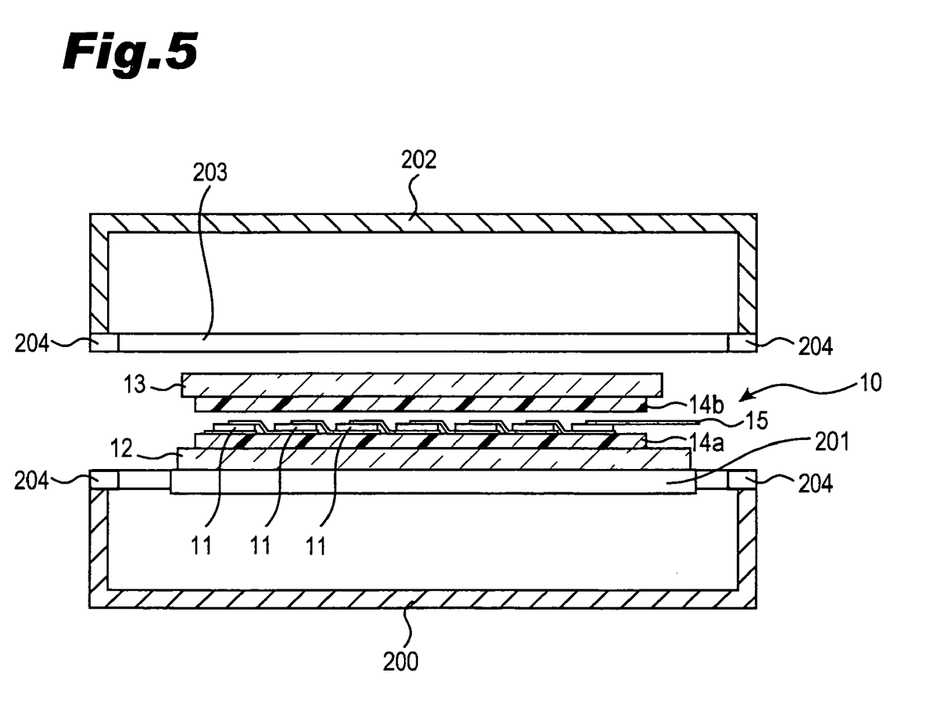
FIG. 5 is a schematic structural diagram of manufacturing equipment for manufacturing photovoltaic submodules used in the present invention.
Figure 6:
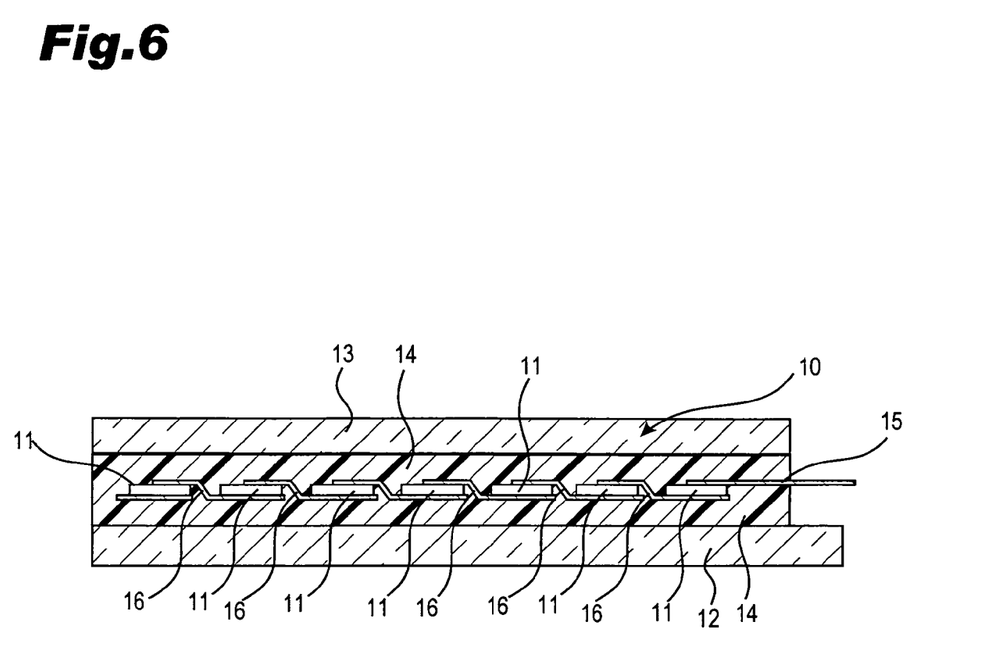
FIG. 6 is a cross-sectional view of a photovoltaic submodule used in the photovoltaic module according to the first embodiment of the present invention.

FIG. 4 is a schematic cross-sectional view illustrating a solar cell used in the present invention. FIG. 5 is a schematic structural diagram of manufacturing equipment for manufacturing photovoltaic submodules used in the present invention. FIG. 6 is a cross-sectional view of a photovoltaic submodule used in the photovoltaic module according to the first embodiment of the present invention.

Figure 7:
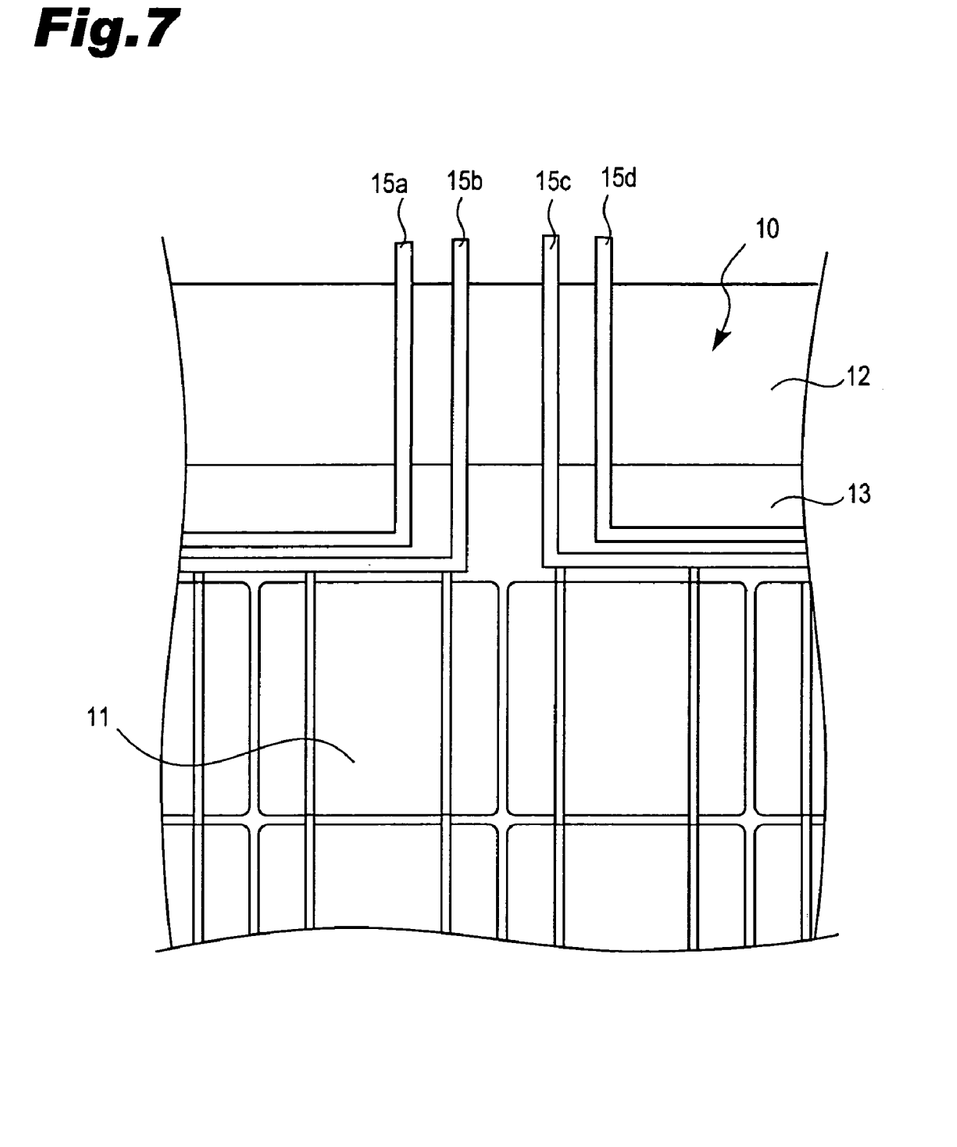
FIG. 7 is a plan view illustrating a part of the connection leads of the photovoltaic submodule used in the present invention.
Figure 8:
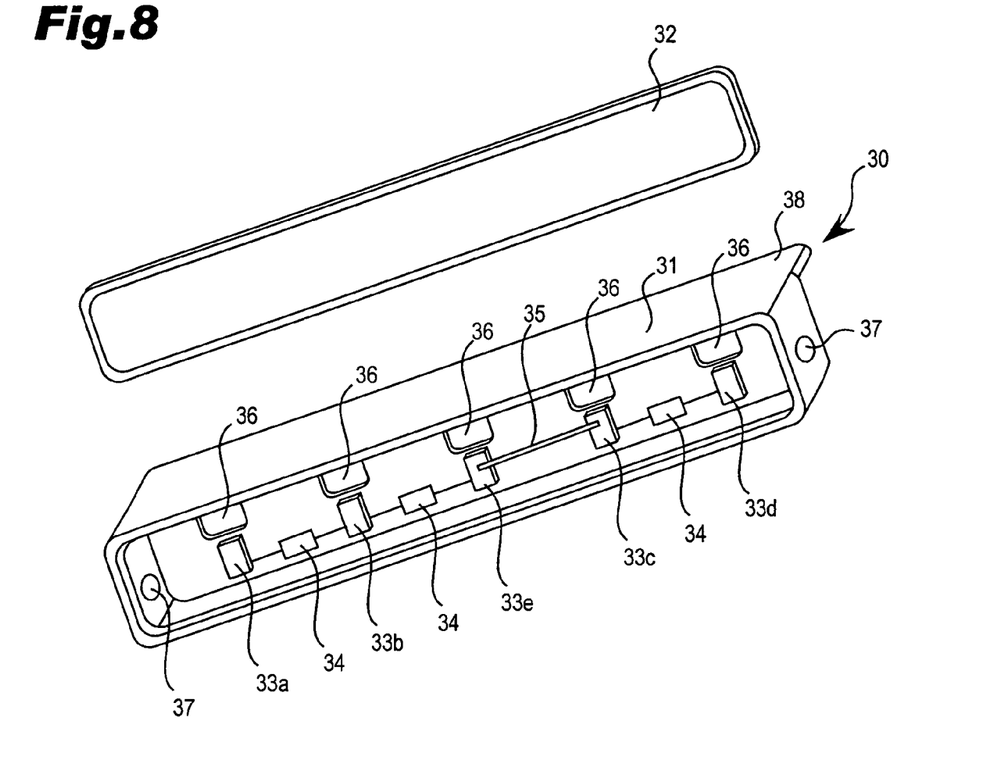
FIG. 8 is an exploded perspective view of a terminal box used in the first embodiment of the present invention.
Figure 9:
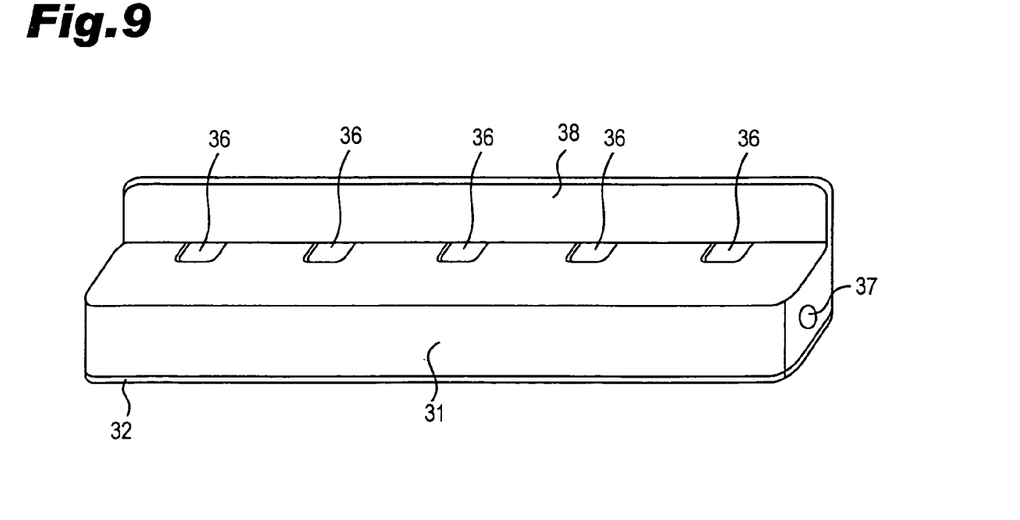
FIG. 9 is a perspective view illustrating the terminal box used in the first embodiment of the present invention.
Figure 10:
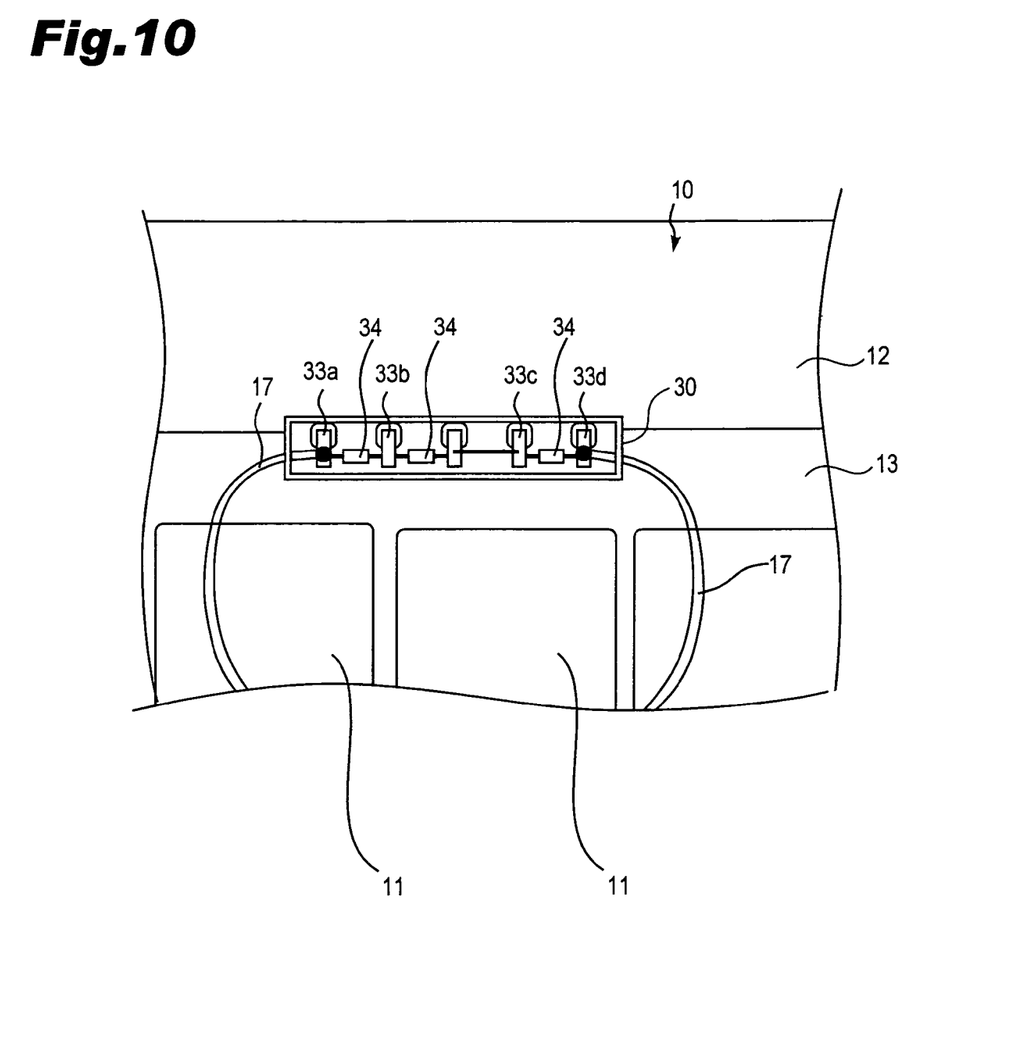
FIG. 10 is a plan view illustrating the terminal box attached to the photovoltaic submodule.

FIG. 7 is a plan view illustrating a part of the connection leads of the photovoltaic submodule used in the present invention. FIG. 8 is an exploded perspective view of a terminal box used in the first embodiment of the present invention. FIG. 9 is a perspective view illustrating the terminal box used in the first embodiment of the present invention. FIG. 10 is a plan view illustrating the terminal box attached to the photovoltaic submodule.

As shown in FIGS. 1-3, the photovoltaic module 1 of the present invention comprises a rectangular double-sided light receiving type photovoltaic submodule 10 including double-sided light receiving type solar cells 11, and a metallic outer frame 20, made of aluminum or stainless steel or made from a roll forming steel sheet, for fitting over peripheral edges of the photovoltaic submodule 10 through the intermediary of a sealing material 40.

The outer frame 20 includes a hollow main body 21 and a fitting part 22 located at the upper part of the main body 21 and having a channel-shape in cross section for fitting over the peripheral edges of the photovoltaic submodule through the intermediary of the sealing material 40. The fitting part 22 is provided with a depressed part 26 for storing the sealing material 40. Out of the four sides of the main body 21, at least two sides, which are opposed to each other, each have rim parts 27 projecting outward from the bottom surface of the main body 21 and further extending upward.

The photovoltaic submodule 10 uses the light-transmitting substrate 12, which is located on the light receiving side of the solar cells 11 and made of low iron tempered glass, and the light-transmitting substrate 13, which is located on the rear side of the solar cells 11 and made of low iron tempered glass, to sandwich the plurality of solar cells 11 with a transparent sealing resin 14 such as EVA (ethylene vinyl acetate) filled in the gap between the substrates 12 and 13.

The light-receiving side light-transmitting substrate 12 and rear surface side light-transmitting substrate 13 are different in size. In this embodiment, the light-receiving side light-transmitting substrate 12 is fabricated so as to be larger than the rear surface side light-transmitting substrate 13. Specifically, the side, of the light-receiving side light-transmitting substrate 12, from which the connection leads 15 as connection member are pulled out is extended outward further than the rear surface side light-transmitting substrate 13. For said connection member, wires, ribbons, or other are used.

Although various types of solar cells, for example, crystalline type and amorphous type can be used for the solar cells 11, attention is being given to a type of solar cell capable of reducing power generation losses in defective areas on the front surface of the solar cell and realizing high power output. This solar cell has substantially intrinsic (i-type) amorphous silicon layers, which means without dopant, each formed between a crystalline substrate and a p-type amorphous silicon layer and between the crystalline substrate and an n-type amorphous silicon layer in order to improve interface properties. These solar cells 11 are connected with inner leads in series or parallel and set so as to generate a predetermined output, for example an output of 200 W through the connection leads 15 from the photovoltaic submodule 10.

The connection leads 15 are applied with insulation coating and pulled out from the edge of the photovoltaic submodule 10, corresponding to the extended side of the light-transmitting substrate 12.

The structure of the aforementioned solar cell 11 will be described with reference to FIG. 4. FIG. 4 is a schematic cross-sectional view illustrating the solar cell used in the embodiments. For an easier understanding of the structure of each layer, thin layers are enlarged in FIG. 4 regardless of the proportion according to an actual thickness of each layer.

As shown in FIG. 4, the solar cell 11 comprises an n-type single crystalline silicon (c-Si) substrate 110 with a (100) plane (hereinafter referred to as n-type single crystalline silicon substrate 110) having resistivity of about 1 Ω·cm and a thickness of about 300 μm, as a crystalline semiconductor substrate. There are pyramidal projections and depressions (not shown) having a height of a few micro meters to several tens of micro meters on a surface of the n-type single crystalline silicon substrate 110. The projections and depressions are made for confining light. As a substantially intrinsic amorphous semiconductor thin film layer including hydrogen, a substantially intrinsic (i-type) amorphous silicon (a-Si:H) layer 112 having a thickness of 3 nm to 250 nm is formed on the n-type single crystalline silicon substrate 110 by an RF plasma CVD method. In addition, a p-type amorphous silicon layer 113 having a thickness of about 5 nm is formed on the i-type amorphous silicon layer 112, as a doped amorphous semiconductor thin film layer including hydrogen.

In this embodiment, an ITO (Indium Tin Oxide) film 114, as a transparent conductive oxide film having a thickness of approximately 100 nm, is formed on the p-type amorphous silicon layer 113 by a magnetron sputtering method. The ITO film 114 is made of $In_2O_3$ (indium oxides) with the addition of $SnO_2$ (tin oxides).

Comb-shaped collector electrodes 115 made of silver paste are formed each at a predetermined region on an upper surface of the ITO film 114. Each collector electrode 115 consists of a bus bar portion and finger portions. Inner leads are connected to the bus bar portion.

A substantially intrinsic (i-type) amorphous silicon layer 116 with a thickness of about 5 nm is formed on a lower surface of the n-type single crystalline silicon substrate 110. An n-type amorphous silicon layer 117 with a thickness of about 20 nm is formed on a lower surface of the i-type amorphous silicon layer 116. Thus the so called Back Surface Field (BSF) structure is formed by laminating the i-type amorphous silicon layer 116 and the n-type amorphous silicon layer 117 in this order on the lower surface of the n-type single crystalline silicon substrate 110. In addition, an ITO film 118 is formed by a magnetron sputtering method, as a transparent conductive oxide film having a thickness of about 100 nm, on the n-type amorphous silicon layer 117. The ITO film 118 is made of $In_2O_3$ with the addition of $SnO_2$.

Comb-shaped collector electrodes 119 made of silver paste are formed each at a predetermined region on the ITO film 118.

An example process of manufacturing the aforementioned solar cell 11 will be described. The n-type single crystalline substrate 110 is cleaned and put into a vacuum chamber to be heated up to an appropriate temperature (200 degrees C. or lower) so that water adhered to the front surface of the substrate is removed as much as possible. Next, hydrogen gas is introduced and the substrate is exposed to plasma discharge to clean the surface thereof.

After that, silane ($SiH_4$) gas and hydrogen gas are introduced to form the non-doped i-type amorphous silicon layer 112. Then $SiH_4$ gas, hydrogen gas and dopant gas of diborane ($B_2H_6$) gas are introduced to form the p-type amorphous silicon layer 113, thereby completing a p-n junction. An indium tin oxide layer is formed by sputtering method to form the front surface side electrode 114. Silver electrodes are screen printed and then hardened under heat to form the collector electrodes 115.

The so-called BSF structure is formed by laminating the non-doped i-type amorphous silicon layer 116 and the n-type amorphous silicon layer 117 on the opposite side of the substrate 110. Next, the rear surface side electrode layer 118 and the collector electrodes 119 are formed in the same manner. The thin film layers are formed sequentially from the rear surface side (n-type side), or from the front surface side (p-type side).

The same applies to a solar cell using a p-type substrate in which a non-doped amorphous silicon layer, an n-type amorphous silicon layer, an indium tin oxide layer, and a silver collector electrode are formed on the front surface side while a non-doped amorphous silicon layer, a p-type amorphous silicon layer, and a rear surface side electrode layer are formed on the rear surface side.

In addition to a single crystalline silicon substrate used as a crystalline semiconductor substrate in the above embodiment, a multicrystalline semiconductor substrate such as a multicrystalline silicon substrate is also available. For the solar cells, various types of solar cells including the other types of crystalline solar cells and amorphous solar cells are available.

The plurality of solar cells 11 formed as described above are aligned at predetermined intervals. The collector electrodes of neighboring solar cells 11, 11 are connected to each other in series or parallel with inner leads made of copper foil for example. The photovoltaic submodule 10 is set so as to generate a predetermined output, for example 200 W, and to output through the connection leads 15 as illustrated in FIGS. 2 and 3.

Next, a method for manufacturing the aforementioned photovoltaic submodule 10 will be described with reference to FIG. 5. Equipment used to manufacture the photovoltaic submodule 10 comprises a lower side chamber 200 and an upper side chamber 202 which will be coupled to the lower side chamber airtightly. A heating plate 201 is provided at an upper opening of the lower side chamber 200 so that the heating plate 201 and the upper opening of the lower side chamber 200 are nearly on the same plane. The upper side chamber 202 includes a rubber diaphragm 203 provided at a side opposed to the opening of the lower side chamber 200. A gasket 204 is provided around the whole circumference of the lower side chamber 200 and the upper side chamber 202 in order to keep the air-tightness after the lower side chamber 200 and the upper side chamber 202 are coupled together. Additionally, a vacuum pump (not shown) is connected to the lower side chamber 200.

In order to manufacture the photovoltaic submodule 10, a light-receiving side light-transmitting substrate 12, an EVA sheet 14a (encapsulant), a plurality of solar cells 11 interconnected with the inner leads 16, an EVA sheet 14b (encapsulant) and a rear surface side light-transmitting substrate 13 are laminated in this order from the bottom, on the heating plate 201 of the manufacturing equipment. Additionally, connection leads 15 are attached to the photovoltaic submodule 10 to take out electric power generated by the solar cells 11.

After the components are laminated on the heating plate 201 as described above, the lower side chamber 200 and the upper side chamber 202 are coupled together. Then the lower side chamber 200 is evacuated by the vacuum pump (not shown), while the heating plate 201 is heated up to approximately 170 degrees C. Under this condition, the diaphragm 203 is pressed against the photovoltaic submodule 10 placed on the heating plate 201 so that the EVA sheets 14a and 14b are gelled to be a predetermined EVA layer 14. This allows the solar cell 11 placed between the front surface side light-transmitting substrate 12 and the rear surface side light-transmitting substrate 13 to be sealed within the EVA layer 14. The photovoltaic submodule 10 shown in FIG. 6 is thus obtained.

As illustrated in FIGS. 1-3, the photovoltaic submodule 10 manufactured as described above is securely fitted in the fitting part 22 of the outer frame 20 using the sealing material 40.

As shown in FIGS. 2 and 3, the terminal box 30 is disposed near the outmost edge of the rear surface side light-transmitting substrate 13 on the side from which the connection leads 15 are pulled out, and attached to the light-transmitting substrate 13 with an adhesive 39.

In this embodiment, the terminal box 30 is provided with an upright part 38 for preventing the connection leads 15 from abutting the inner wall of the outer frame 20 when the photovoltaic submodule 10 is set in the outer frame 20. The upright part 38 is continuously formed on the main body 31 in this example.

The connection leads 15 are routed through between the upright part 38 and the outmost edge of the rear surface side light-transmitting substrate 13.

Next, one example of the terminal box 30 used in the above-described embodiment of the present invention will be described by referring to FIGS. 7-10. FIG. 7 is a plan view illustrating a part of the connection leads of the photovoltaic submodule 10 used in the present invention; FIG. 8 is an exploded perspective view of a terminal box used in the first embodiment of the present invention; FIG. 9 is a perspective view illustrating the terminal box used in the first embodiment of the present invention; and FIG. 10 is a plan view illustrating the terminal box attached to the photovoltaic submodule.

As illustrated in FIG. 7, the photovoltaic submodule 10 of this embodiment includes four connection leads 15a, 15b, 15c and 15d led out from an edge of a shorter side of the photovoltaic submodule. Each of the connection leads has insulating coating. For example, the connection lead 15a and the connection lead 15d are pulled out from the edge of the photovoltaic submodule 10 to serve as a negative terminal and a positive terminal, respectively. The connection leads 15b and 15c to install bypass diodes are pulled out from the edge of the photovoltaic submodule 10. For example, a plurality of solar cells 11 are connected in series to form a string. The photovoltaic submodule 10 comprises six such strings connected in series. The connection leads 15a and 15d are each connected to a string and led out as a negative terminal and a positive terminal, respectively, while the connection leads 15b and 15c to install bypass diodes are connected to other strings to which the connection leads 15a and 15d are not connected. Bypass diodes connected among the connection leads allow the photovoltaic module 1 to output electric power even when shadow or other factors cause any one of the strings to reduce its output power. For this reason, the connection leads 15a, 15b, 15c and 15d are connected in series through bypass diodes in the terminal box 30.

As illustrated in FIG. 8, the terminal box 30 comprises a box-shaped main body 31 having one side open and a lid 32 put on the opening side to close it tightly. The main body 31 and the lid 32 are formed by resin molding.

The terminal box 30 is provided with terminal blocks 33a, 33b, 33c, 33d and 33e inside the main body 31, each corresponding to a connection lead. The terminal box 30 is also provided with insertion holes 36 into which the connection leads are inserted, on the bottom of the main body 30, each corresponding to the terminal blocks 33a, 33b, 33c, 33d and 33e, respectively. Insertion holes 37 into which the cable is inserted are provided at both lateral sides of the main body 31.

In this embodiment, five terminal blocks are provided for four connection leads. No connection lead is connected to the terminal block 33e in this embodiment. Therefore, the terminal block 33e and the terminal block 33c are connected through a jumper wire. A bypass diode 34 is connected between the terminal blocks 33a and 33b, the terminal blocks 33b and 33e, and the terminal blocks 33c and 33d.

The connection between the terminal box 30 and the connection leads 15a, 15b, 15c and 15d are made as follows: the connection leads 15a, 15b, 15c and 15d individually pass through the insertion holes 36; and the connection leads 15a, 15b, 15c and 15d are soldered to the terminal blocks 33a, 33b, 33c and 33d, respectively. A cable 17 inserted through an insertion hole 37 is fixed firmly to the terminal block 33a by crimping for example. Similarly, the other cable 17 inserted through the other insertion hole 37 is fixed firmly to the terminal block 33d by crimping for example. If necessary, a bushing may be attached to the insertion hole 37 to enhance waterproofness. Additionally, though not shown, a member to prevent the cable from slipping off may be provided to the terminal box 30 to enhance mechanical strength.

Thus the connection leads 15a, 15b, 15c and 15d are connected in series through the terminal box 30. The cable 17 for a positive electrode and the other cable 17 for a negative electrode are led out from the terminal box 30.

In this embodiment, the side of the light-receiving side light-transmitting substrate 12, from which the connection leads 15 are taken out is made large so that the side extends outward further than the rear surface side light-transmitting substrate 13. According to the structure, as shown in FIGS. 2 and 3, the fitting part 22a of the outer frame 20, into which the side of the light-transmitting substrate 12 is fitted, catches only the light-receiving side light-transmitting substrate 12. On the other hand, fitting parts 22 of the other three sides of the outer frame 20 catch both the light-transmitting substrates 12 and 13. The fitting part 22a is therefore formed to have a narrower cavity than those of the other fitting parts 22. Since the hollow parts 28 of the outer frame 20 are all the same in dimension in this embodiment, the lower part 22b of the fitting part 22a is made thick so as to narrow the cavity.

In the photovoltaic module 1 of the embodiment, as shown in FIGS. 2 and 3, the terminal box 30 is attached near the outmost edge of the rear surface side light-transmitting substrate 13 of the photovoltaic submodule 10 with adhesive 39. With the upright part 38 of the terminal box 30 located adjacent to or abutting the outer frame, the light-transmitting substrate 12 of the photovoltaic submodule 10 is fitted into the fitting part 22a, while the three other sides of the photovoltaic submodule 10 are fitted into the fitting parts 22, and sealing material 40 secures the photovoltaic submodule 10.

In this embodiment, the connection leads 15 are routed from between the upright part 38 and the outmost edge of the rear surface side light-transmitting substrate 13 to be inserted into the terminal box 30. This structure makes it easier to handle the connection leads 15. In addition, there is no conventional problem of disconnection and insulation failures of the connection leads 15 because the connection leads 15 are not drawn into the fitting part 22a.

As discussed above, the connection leads 15 can be routed into the terminal box 30 though the gap between the upright part 38 of the terminal box 30 and the edge of the photovoltaic submodule 10. Consequently, the connection leads 15 are blocked by the upright part 38 of the resin terminal box 30 so as not to directly abut the outer frame 20, thereby fully ensuring insulation properties of the connection leads 15 even having a thin insulating coat.

The above-discussed photovoltaic submodule 10 in the first embodiment is configured so as not to arrange the solar cells 11 in a region positioned above the terminal box 30. This region is an ineffective region in the area, as shown in FIG. 1. The second embodiment shown in FIG. 11 is made in order to effectively use this ineffective region in the area.

Figure 11:
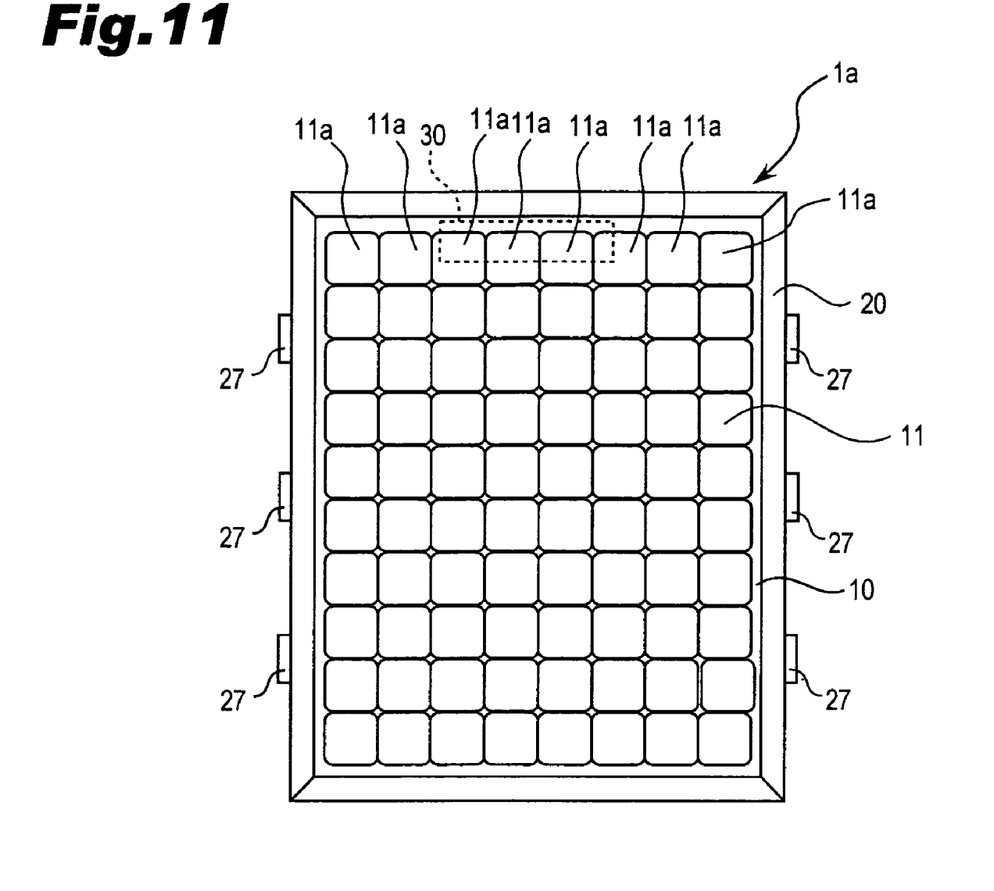
FIG. 11 is a plan view illustrating a photovoltaic module according to the second embodiment of the present invention.

As shown in FIG. 11, in the photovoltaic module 1a of the second embodiment, dummy cells 11a are placed, as if the solar cells 11 are arranged orderly, in the region on the light-transmitting substrate 12 and above the terminal box 30, in which the solar cells are not provided. This arrangement of the dummy cells 11a enhances the design of the photovoltaic module 1. The dummy cells 11a can be stuck or printed at predetermined positions on the light-transmitting substrate 12.

If the dummy cells 11a are subjected to a treatment so as to irregularly reflect light, which would have passed through the photovoltaic submodule 10 without the dummy cells 11a, into the solar cells 11, the photovoltaic module 1 can improve the utilization efficiency of light.

Figure 12:
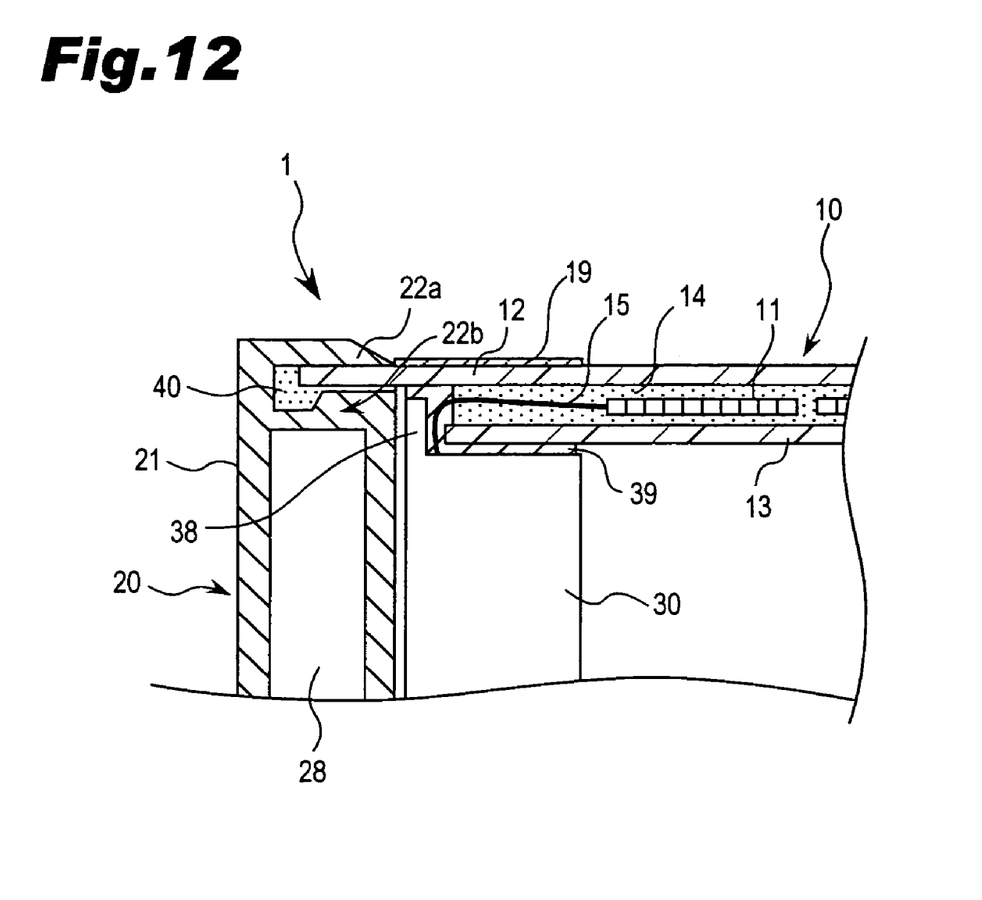
FIG. 12 is a cross-sectional view of a relevant part of a photovoltaic module according to the third embodiment of the present invention.

FIG. 12 is a cross-sectional view of a relevant part of a photovoltaic module according to the third embodiment of the present invention.

As illustrated in FIG. 12, the terminal box 30 is attached near the outmost edge of the rear surface side light-transmitting substrate 13 of the photovoltaic submodule 10. A printed area (a colored area) 19 is provided on the light-receiving side light-transmitting substrate 12 and above the terminal box 30. As illustrated in FIG. 12, the printed area 19 can hide the adhesive used for attaching the terminal box 30 to the rear surface side light-transmitting substrate 13 when viewed from the light-receiving side. The terminal box 30 can be made invisible too from the light-receiving side, which makes it more aesthetically pleasing of the photovoltaic module.

The printed area 19 does not need to be shaped like the dummy cell but can have any shape as long as the printed area can serve as a masking part for hiding the terminal box 30 and other parts. The printed area 19 with similar colors to the solar cell 11 can provide the same effect. The colored area can be provided in the printed area and in other methods as well.

Although the light-transmitting substrate 13 is used for a substrate placed on the rear side of the solar cells in the above-discussed embodiment, the present invention can be applied to a photovoltaic module including an insulative rear surface member having no light transmittance.

The present invention is applied to photovoltaic power generation devices.

It should be understood that the embodiments disclosed herein are to be taken as examples and are not limited. The scope of the present invention is defined not by the above described embodiments but by the following claims. All changes that fall within meets and bounds of the claims, or equivalence of such meets and bounds are intended to be embraced by the claims.

What is claimed is:

1. A photovoltaic module comprising:
a photovoltaic submodule including a plurality of solar cells interposed between a light-transmitting front surface member and rear surface member through the intermediary of an encapsulant, and connecting members extending out from an edge between said front surface member and rear surface member, said connecting members outputting generated electric currents;
a terminal box attached near an edge of the photovoltaic submodule, said terminal box is attached to the rear surface member which is located adjacent to or abutting the outer frame, said terminal box housing connection parts between said connecting members and cables for outputting the electric currents to the outside; and
an outer frame fitting over peripheral edges of said photovoltaic submodule, wherein
said front surface member is made large so that at least one side corresponding to the edge from which said connecting members are pulled out is extended outward further than said rear surface member;
said connecting members are led out from the submodule in the position between the outer frame and the rear surface member from between said extended front surface member and the outmost edge of the rear surface member, and guided into said terminal box;
wherein on the side of the photovoltaic submodule in which the side of said front surface member is extended outward further than the rear surface member, said outer frame fits only over the front surface member;
on the other sides of the photovoltaic submodule, said outer frame fits over the front surface member and rear surface member, and
the outer frame includes a fitting part having a channel-shape in cross section for fitting over the photovoltaic submodule.

2. The photovoltaic module according to claim 1, wherein said terminal box is made of resin and provided with an upright part extending toward the front surface member, and
said connecting members pass through between the upright part of said terminal box and the outmost edge of the rear surface member of the photovoltaic submodule to be guided in the terminal box.

3. The photovoltaic module according to claim 1, wherein dummy cells are provided in a region positioned on the light-transmitting front surface member and above the terminal box.

4. The photovoltaic module according to claim 1, wherein a colored area in the form of dummy cell is provided in a region positioned on the light-transmitting front surface member and above the terminal box.

5. The photovoltaic module according to claim 1, wherein a colored masking area is provided in a region positioned on the light-transmitting front surface member and above the terminal box.

6. The photovoltaic module according to claim 1, wherein a colored masking area with similar colors to the solar cell is provided in a region positioned on the light-transmitting front surface member and above the terminal box.

7. The photovoltaic module according to claim 1, wherein said rear surface member is a light-transmitting member, and said photovoltaic submodule is a double-sided light receiving type photovoltaic submodule.

* * * * *